United States Patent
Lee et al.

[11] Patent Number: 6,086,705
[45] Date of Patent: Jul. 11, 2000

[54] BONDING OF MICRO ELEMENTS

[75] Inventors: Shih-Ping Lee; Kuo-Kang Liu, both of Hsinchu, Taiwan

[73] Assignee: Industrial Technology Research Institute, Hsinchu, Taiwan

[21] Appl. No.: 09/152,669

[22] Filed: Sep. 14, 1998

[51] Int. Cl.[7] .............................. B32B 31/24; H05K 3/30
[52] U.S. Cl. .................. 156/273.1; 156/274.2; 156/275.7; 29/832; 257/783
[58] Field of Search .................. 156/273.1, 273.9, 156/274.2, 275.7; 219/78.01, 117.1, 148, 85.1, 85.22; 361/767, 768, 770, 783; 257/782, 783, 778; 29/832, 840

[56] References Cited

U.S. PATENT DOCUMENTS

| | | | |
|---|---|---|---|
| H000629 | 4/1989 | Murdoch | 257/782 |
| 4,184,043 | 1/1980 | Hildering | 29/840 |
| 4,506,139 | 3/1985 | Daughton | 219/209 |
| 5,624,750 | 4/1997 | Martinez et al. | 156/273.9 |
| 5,951,893 | 9/1999 | Bitko et al. | 361/768 |

Primary Examiner—Michael W. Ball
Assistant Examiner—Michael A Tolin
Attorney, Agent, or Firm—Bacon & Thomas

[57] ABSTRACT

A novel method for bonding of micro elements with in-situ bonding means is disclosed. Suited bonding means include heating coils and bonding materials. The bonding means are provided in the elements to be bonded during their preparation. While the elements are bonded, electric power is applied to the heating coil such that the bonding material is melt and that the elements are bonded. An elastic calibration means is provided in at least one of the elements to be bonded such that the distance and parallelism of the elements may be calibrated during the bonding process.

6 Claims, 1 Drawing Sheet

6,086,705

BONDING OF MICRO ELEMENTS

FIELD OF INVENTION

The present invention relates to a method for the bonding of micro elements, especially to a method for the aligned bonding of micro elements with in-situ means. This invention also disclosed elements suited for the in-situ bonding method of this invention.

BACKGROUND OF INVENTION

The "micro system" is a term used to indicate all electromechanical and optical elements with miniature sizes. The processing of the micro system and its elements is called micro machining. In the field of micro machining, bonding or joining of micro elements is one of the key technologies. When two or more micro elements are to be bonded, the tolerance of errors in the distance and parallelism of the elements are always limited to a nano-meter scale. Under this and other requirements, bonding of micro elements has become a great task in the micro machining technology.

In the prior art, bonding of micro elements is operated with the help of piezoelectric translators or micromanipulators, such that the distance and parallelism of two or more elements may be finely adjusted. Bonding of micro elements includes steps of placing, alignment and heating of the elements. Due to the small sizes (generally between 100 and 10,000 $\mu m^3$) of the elements to be bonded, sophisticated equipments shall be used and relatively long operation time is required. Nevertheless, the precision of the bonding may not be expected. Furthermore, because heating and pressing steps are applied, the distance and parallelism of the elements may not be calibrated during the bonding. These and other disadvantages made the bonding technology complicated and expensive.

It is thus a need in the industry to have a novel method for the bonding of micro elements so that time-saving, low-cost and high precision may be achieved.

It is also a need in the industry to have a bonding method for miniature elements such that distance and parallelism of elements may be calibrated during the bonding process.

OBJECTIVES OF THE INVENTION

The objective of this invention is to provide a novel bonding method for micro elements that is time-saving, low-cost and high precision.

Another objective of this invention is to provide a novel bonding method for micro elements where the distance and parallelism of elements may be calibrated during the bonding process.

Another objective of this invention is to provide a method for bonding micro elements equipped with in-situ bonding means.

Another objective of this invention is to provide elements suited for the bonding method of this invention.

SUMMARY OF THE INVENTION

According to the method for bonding of micro elements of this invention, micro elements to be bonded are provided with in-situ bonding means, which enables the bonding of the elements. Suited bonding means include heating coils and bonding materials. The bonding means are provided in the elements to be bonded during its preparation. While the elements are bonded, electric power is applied to the heating coil such that the bonding material is melt and that the elements are bonded. An elastic calibration means is provided in at least one of the elements to be bonded such that the distance and parallelism of the elements may be calibrated during the bonding process.

These and other objectives and advantages of this invention may be clearly understood from the detailed description by referring to the following drawings.

IN THE DRAWINGS

DETAILED DESCRIPTION OF THE INVENTION

This invention discloses a novel bonding method for micro elements. One of the major characteristics is that in-situ bonding means are provided in the elements to be bonded during their preparation. Bonding means suited in this invention include heating coils and bonding materials; both are provided within joining regions of the micro elements to be bonded. In the embodiment of this invention, the heating coils may be prepared with materials such as aluminum, platinum or other high ohmic metals. The pattern of the coils may be meandering or other suited shapes. As to the bonding materials, indium or other solders are good examples. The bonding means are deposited to the elements by evaporation or other deposition technologies during the preparation of the elements.

When bonding the elements, the elements are aligned and electric power is applied to the heating coils so that the bonding materials melt. Pressure is applied to the elements such that the elements are bonded with a distance between them. Because of the in-situ bonding means, no external bonding means are required. Positioning in a high accuracy is achieved without the need of complicated control and adjustments.

In the embodiment of this invention, an elastic calibration means is used to calibrate the distance and parallelism of the bonded elements. The elastic calibration means may be a micromachined corrugation and an electrostatic position adjustment circuit, provided in at least one element to be bonded, respectively. By using the electrostatic force of the electrostatic position adjustment circuit and the restoring force of the corrugated structure, fine tuning of the distance and parallelism of the elements in a high accuracy may be achieved.

The following is a detailed description of the embodiment of the bonding method of micro elements of this invention.

Embodiment

Figure 1:
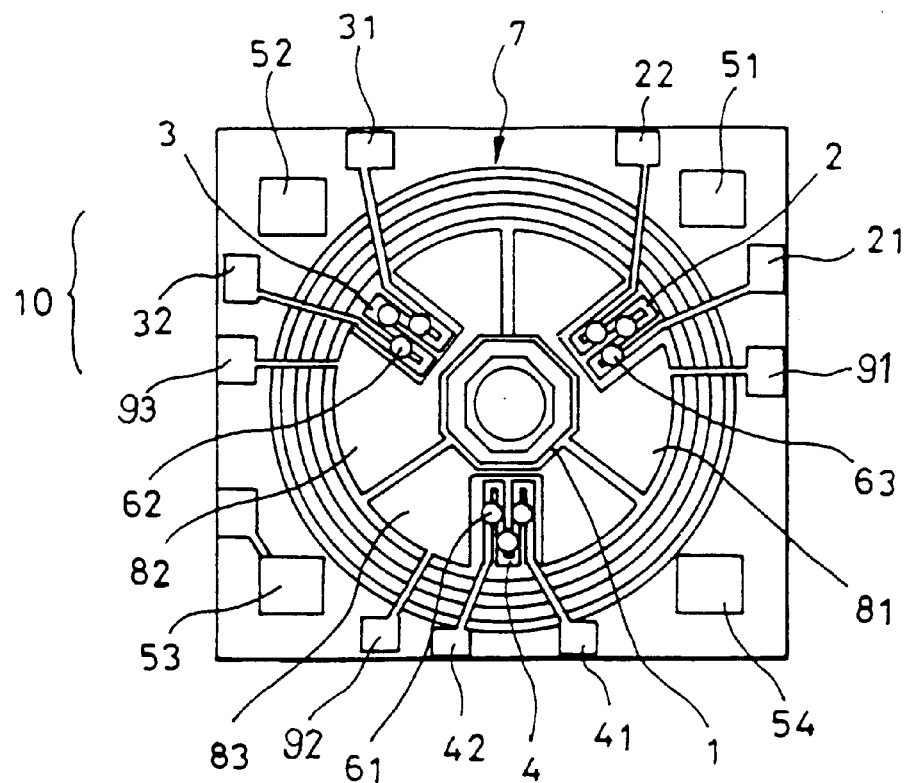
FIG. 1 illustrates the top view of a micro element to be bonded with the bonding method of this invention.
Figure 2:
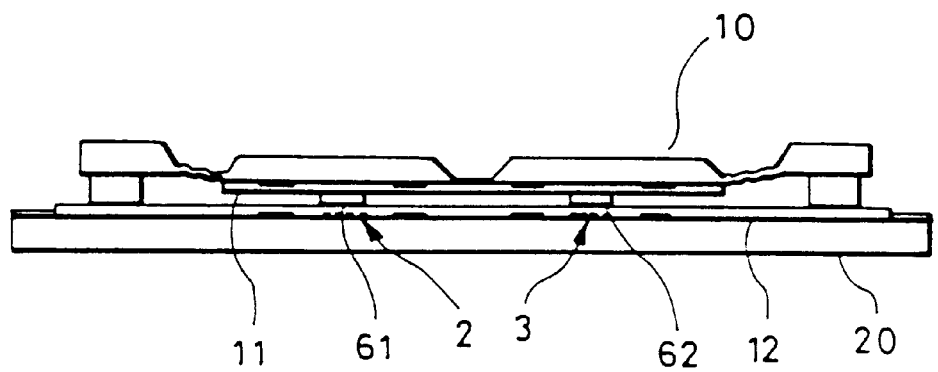
FIG. 2 illustrates the sectional view of a bonded assembly of micro elements, as prepared according to the bonding method of this invention.

FIG. 1 illustrates the top view of a micro element to be bonded with the bonding method of this invention. FIG. 2 illustrates the sectional view of a bonded assembly of micro elements, as prepared according to the bonding method of this invention. In these drawings, the same components are labeled with same numbers.

Now refer to FIG. 1. In this figure, shown is a micro element 10 to be bonded. As shown, the first micro element 10 has a surface 1 to be aligned in parallel with another micro element. Three heating coils 2, 3 and 4 are provided on the element 10 and are electrically connected to electrodes 21 and 22, 31 and 32 and 41 and 42 with leads. At the four corners of the element 10 are spacers 51, 52, 53 and 54. In this embodiment, electrodes 21, 22, 31, 32, 41 and 42, leads and coils 2, 3, 4 may be prepared with aluminum material and may be evaporated onto element 10. Of course, other heating material and deposition technologies may be also applied. The spacers 51, 52, 53 and 54 may be polyimide. Other materials that are suited to provide a space between elements and suited in semiconductor processing are applicable in this invention. Bonding materials 61, 62 and 63 are deposited on the heating coils 2, 3 and 4, respectively. In this embodiment, the bonding materials 61, 62 and 63 are indium and are evaporated onto the coils 2, 3, and 4. No need to say that other bonding material, such as alloy of indium and tin, other solders, and other deposition processes may also be applicable in this invention.

The micro element 10 has a corrugated structure 7. The corrugated structure 7 may be prepared with any suited process, so to provide an elastic adjustment of the relative planar position of the central area (the surface 1) and the surrounding area of the element 10. In other embodiments of this invention, such elastic adjustment is achieved by using the elastics of the substrate of the element 10, such that no corrugated is needed.

The micro element 10 has electrostatic force generating regions 81, 82 and 83. In this embodiment, these electrostatic force generating regions 81, 82 and 83 are implemented with aluminum foils. The aluminum foils 81, 82 and 83 are electrically connected to electrodes 91, 92 and 93, respectively, with leads. When electric power is applied to the aluminum foils 81, 82 and 83, electrostatic attraction force is generated at the surface of the aluminum foils 81, 82 and 83.

In bonding two micro elements, another micro element 20 is prepared. The second micro element 20 may have the same structure of micro element 10. In order to save manufacture cost, it is possible that the second micro element 20 does not have the corrugated structure 7 and the aluminum foils 81, 82 and 83. This, however, may be decided according to the application of the micro elements 10 and 20.

Now refer to FIG. 2, which illustrates the sectional view of a bonded assembly of micro elements, as prepared according to the bonding method of this invention. In this figure, a first micro element 10 is assigned to a second micro element 20. In practice, protection layers 11 and 12 are prepared on the micro elements 10 and 20 on the surfaces facing the other, respectively. The protection layers 11 and 12 may be any insulation material and in this embodiment, are $SiO_2$ with the thickness of about 5000Å. Apply electric power to the heating coils 2, 3 and 4 of the micro elements 10 and 20 and the indium blocks 61, 62 and 63 will melt to drops. The compression-resisting force generated by the surface tension of the indium drops sustains the distance between the elements 10 and may be used to calibrate the distance and parallelism of the elements. Generally speaking, if the corrugated structure 7 has a thickness of about 5 $\mu$m and an area of about 1 mm$^2$, a restoring force of about 70 mN may be generated. For an indium drop with diameter of about 15 $\mu$m, a compression-resisting force of about 0.8 mN may be generated. As a result, if the area of the aluminum foils 81, 82, and 83 is about 4 mm$^2$, applying 90V to the foils 81, 82 and 83 will generate attraction force sufficient to pull the elements 10 and 20 towards each other for about 0.1 $\mu$m. Since the restoring force of the corrugated structure 7 is about one hundred times the compression-resisting force of the indium drops 61, 62 and 63, the electrostatic force and the restoring force may be used to calibrate the distance and parallelism of the elements 10 and 20 and fine tuning may be achieved.

When the distance and parallelism of the elements is calibrated, stop the power supplied to the heating coils 2, 3 and 4, such that the indium drops 61, 62 and 63 are completely solidified. The elements 10 and 20 are thus bonded. The preciseness of the distance and parallelism of the elements 10 and 20 may reach the nano meter scale.

Effects of the Invention

As described above, the elements to be bonded contain in-situ bonding means. The in-situ bonding means provide short thermal response time and are able to enhance the efficiency of the bonding. The invented bonding means are easy to manufacture under conventional semiconductor or micro machining processes. It is no need to use special manufacture equipments. Since the bonding means are contained in the elements to be bonded, no complicated bonding equipment will be necessary. The bonding process may thus be simplified. These advantages may be reflected in the manufacture cost. As the elastic calibration means are used, distance and parallelism of the bonded elements may be calibrated to a precision of nano-meter scale. The calibration may be conducted during the bonding process. Time and cost required in the calibration is thus saved.

As the present invention has been shown and described with reference to preferred embodiments thereof, those skilled in the art will recognize that the above and other changes may be made therein without departing from the spirit and scope of the invention.

What is claimed is:

1. A method for bonding two elements, comprising the following steps:

prepare two substrates;

form on at least one of said substrates at least one heating coil and at least two electrodes connected electrically to said at least one heating coil with leads;

form a bonding material on said at least one heating coil;

align said two substrates;

supply an electric power to said at least two electrodes such that said at least one heating coil generates heat to melt said bonding material;

stop said electric power such that said bonding material solidifies and said two substrates are bonded; and further comprising a step of forming an elastic calibration means in at least one substrate to provide elastic calibration of a relative position of said two substrates while said at least one heating coil is being supplied electric power.

2. The method according to claim 1 wherein said elastic calibration means comprises a corrugated structure formed in at least one substrate and an electrostatic force generating means in at least one substrate.

3. The method according to claim 2 wherein said electrostatic force generating means comprises a metal membrane and two electrodes connected electrically to said metal membrane with leads.

4. A method for bonding two elements, comprising the following steps:

prepare two substrates;

form on at least one of said substrates at least one heating coil and at least two electrodes connected electrically to said at least one heating coil with leads;

form a bonding material on at least one substrate at a position corresponding to said at least one heating coil;

align said two substrates;

supply an electric power to said at least two electrodes such that said at least one heating coil generates heat to melt said bonding material;

stop said electric power such that said bonding material solidifies and said two substrates are bonded; and further comprising a step of forming an elastic calibration means in at least one substrate to provide elastic calibration of a relative position of said two substrates while said at least one heating coil is being supplied electric power.

5. The method according to claim 4 wherein said elastic calibration means comprises a corrugated structure formed in at least one substrate and an electrostatic force generating means in at least one substrate.

6. The method according to claim 5 wherein said electrostatic force generating means comprises a metal membrane and two electrodes connected electrically to said metal membrane with leads.

* * * * *